United States Patent
Muramatsu et al.

(10) Patent No.: US 9,437,553 B2
(45) Date of Patent: Sep. 6, 2016

(54) ELECTRONIC DEVICE

(71) Applicant: FUJITSU COMPONENT LIMITED, Tokyo (JP)

(72) Inventors: Tohru Muramatsu, Tokyo (JP); Takeshi Wakui, Tokyo (JP); Toshiya Koyama, Tokyo (JP); Masakazu Muranaga, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 14/283,396

(22) Filed: May 21, 2014

(65) Prior Publication Data
US 2014/0346653 A1    Nov. 27, 2014

(30) Foreign Application Priority Data
May 27, 2013   (JP) ................. 2013-111241

(51) Int. Cl.
*H01L 23/552*    (2006.01)
*H01L 25/16*    (2006.01)

(52) U.S. Cl.
CPC ............ *H01L 23/552* (2013.01); *H01L 25/16* (2013.01); *H01L 2224/16225* (2013.01); *H01L 2924/1531* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01)

(58) Field of Classification Search
CPC ............ H01L 23/60; H01L 2924/3025; H01L 23/5225; H01L 23/552; H01L 25/16; H01L 2924/19105; H01L 31/02164; H01L 2225/06537
USPC ........ 257/659, 660, 508, 340, 422; 438/731, 438/637
See application file for complete search history.

(56) References Cited

U.S. PATENT DOCUMENTS

2008/0296697 A1*   12/2008   Hsu .............. H01L 23/49827
                                                              257/379
2014/0035097 A1*   2/2014   Lin .............. H01Q 21/065
                                                              257/531

FOREIGN PATENT DOCUMENTS

JP   2006-147886   6/2006

* cited by examiner

*Primary Examiner* — Jarrett Stark
*Assistant Examiner* — Shahed Ahmed
(74) *Attorney, Agent, or Firm* — IPUSA, PLLC

(57) ABSTRACT

An electronic device includes a first substrate including a first electrode formed on a surface of the first substrate, an electronic component mounted on another surface of the first substrate, a second substrate placed on the first substrate via the electronic component, and a shield disposed between the first substrate and the second substrate.

10 Claims, 9 Drawing Sheets

ELECTRONIC DEVICE

CROSS-REFERENCE TO RELATED APPLICATION

The present application is based upon and claims the benefit of priority of Japanese Patent Application No. 2013-111241, filed on May 27, 2013, the entire contents of which are incorporated herein by reference.

BACKGROUND OF THE INVENTION

1. Field of the Invention

An aspect of this disclosure relates to an electronic device.

2. Description of the Related Art

There exists a substrate package that includes a first circuit substrate including a first surface on which a wiring pattern is formed, a second circuit substrate including a first surface on which a wiring pattern is formed, and multiple chip components. The first circuit substrate and the second circuit substrate are disposed such that their first surfaces face each other at a constant distance. The chip components are placed between the first and second circuit substrates. In the substrate package, at least one of second surfaces of the first and second circuit substrates is covered by a ground pattern, some of the chip components are connection chip components each of which includes terminals that are disposed at the corresponding ends and fixed to the wiring patterns of the first and second circuit substrates. Thus, in the substrate package, the wiring patterns are electrically connected to each other and the first and second circuit substrates are joined together by the connection chip components (see, for example, Japanese Laid-Open Patent Publication No. 2006-147886).

A related-art electronic device such as the substrate package described above does not include a shield structure. Therefore, when, for example, an analog circuit for radio communications is formed on the first circuit substrate or the second circuit substrate, it is not possible to shield electromagnetic waves emitted from the analog circuit. Thus, related-art electronic devices have a low shielding performance.

SUMMARY OF THE INVENTION

In an aspect of this disclosure, there is provided an electronic device that includes a first substrate including a first electrode formed on a surface of the first substrate, an electronic component mounted on another surface of the first substrate, a second substrate placed on the first substrate via the electronic component, and a shield disposed between the first substrate and the second substrate.

DESCRIPTION OF EMBODIMENTS

Embodiments of the present invention are described below with reference to the accompanying drawings.

First Embodiment

Figure 1A:
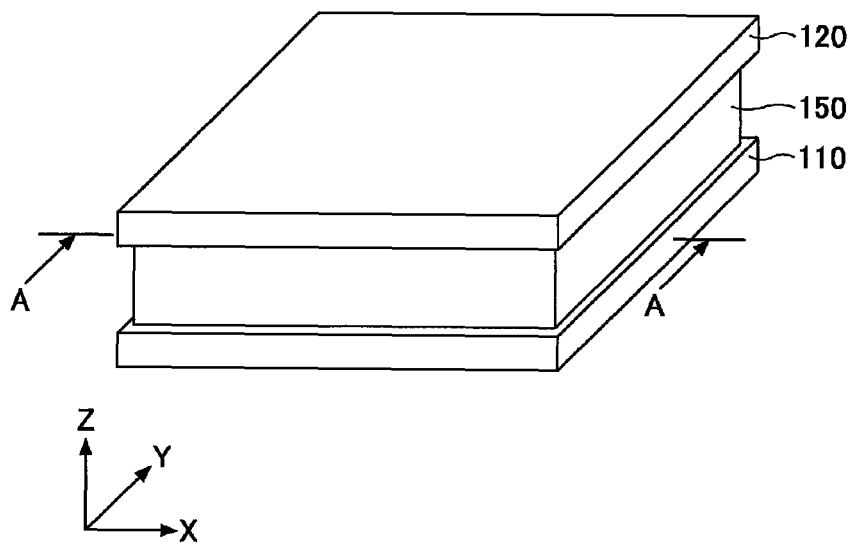
FIGS. 1A and 1B are drawings illustrating an electronic device according to a first embodiment.
Figure 1B:
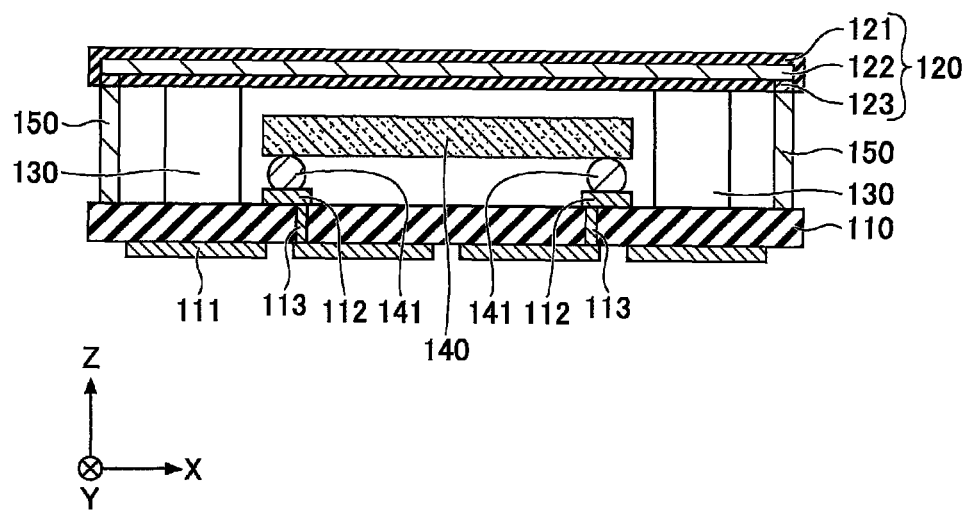
Figure 2:
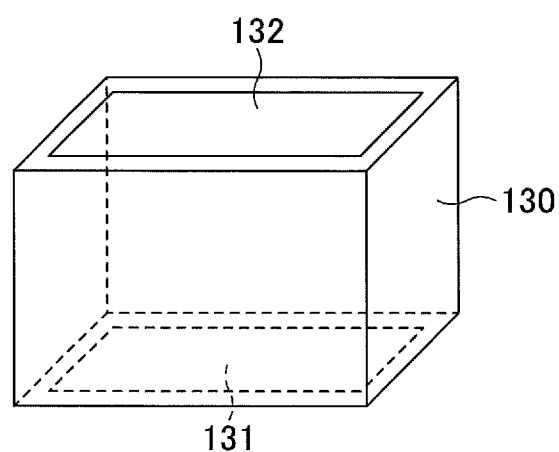
FIG. 2 is a drawing illustrating an electronic component.

FIG. 1A is a perspective view of an electronic device 100 according to a first embodiment, and FIG. 1B is a cross-sectional view of the electronic device 100 taken along line A-A in FIG. 1A. In FIGS. 1A and 1B, an XYZ coordinate system, which is an orthogonal coordinate system, is defined. In the descriptions below, a surface that faces the positive Z direction is referred to as an "upper surface", and a surface that faces the negative Z direction is referred to as a "lower surface". FIG. 2 is a drawing illustrating an electronic component 130 of the electronic device 100.

The electronic device 100 includes a substrate 110, a substrate 120, electronic components 130, an integrated circuit (IC) chip 140, and a shield 150. The electronic device 100 is a surface mount device. For example, the electronic device 100 is surface-mounted on a motherboard (not shown) by connecting a lower surface of the substrate 110 to the motherboard.

The substrate 110 is an example of a first substrate and may be implemented, for example, by a Flame Retardant type 4 (FR-4) printed circuit board. The electronic components 130 and the IC chip 140 are mounted on an upper surface of the substrate 110. Also, the shield 150 is disposed on the upper surface of the substrate 110.

The substrate 110 includes electrodes 111, pads 112, and through holes 113. Multiple electrodes 111 are formed on the lower surface of the substrate 110. The electrodes 111 are an example of a first electrode and configured for an interface of, for example, a Universal Serial Bus (USB) terminal or a Secure Digital (SD) card. For example, a connector for a USB terminal or an SD card is electrically connected to the electrodes 111.

The pads 112 are disposed on the upper surface of the substrate 110. Terminals of the IC chip 140 are connected via solder balls 141 to the pads 112. The pads 112 are also connected via the through holes 113 to some of the electrodes 111.

The substrate 110 includes, in addition to the through holes 113, wiring or through holes for connecting terminals of the electronic components 130 with the electrodes 111. Although not illustrated in FIG. 1, the wiring of the substrate 110 is formed on the upper surface or the lower surface, or inside of the substrate 110.

The substrate 120 is an example of a second substrate. Similarly to the substrate 110, the substrate 120 may be implemented, for example, by an FR-4 printed circuit board. The substrate 120 is placed on the substrate 110 via the electronic components 130.

The substrate 120 includes an insulating layer 121, a conductive layer 122, and a via 123. The insulating layer 121 covers the upper and lower surfaces of the conductive layer 122. The conductive layer 122 is connected through the via 123 to the shield 150. The conductive layer 122 is connected through the via 123, the shield 150, and the substrate 110 to a ground potential. Thus, the conductive layer 122 functions as a ground layer. The upper end of the via 123 in FIG. 1B is connected to the conductive layer 122, and the lower end of the via 123 is exposed on the lower surface of the substrate 120 and is connected to the shield 150 with, for example, solder or a conductive adhesive. The substrate 120 includes at least one via 123.

As illustrated by FIG. 2, the electronic component 130 is a chip electronic component and includes a terminal 131 on the lower surface and a terminal 132 on the upper surface. The terminal 131 is an example of a first terminal, and the terminal 132 is an example of a second terminal. The electronic component 130 may be a chip component such as a capacitor, an inductor, or a resistor, or may be a chip component including filter or a diode.

The terminals 131 and 132 are electrically connected to the substrates 110 and 120 in FIG. 1, respectively. The terminal 131 of the electronic component 130 is connected to the IC chip 140 via, for example, wiring of the substrate 110. Thus, the electronic component 130 and the IC chip 140 are connected to each other via, for example, wiring of the substrate 110.

The electronic component 130 is connected between a circuit formed on the substrate 110 and a circuit formed on the substrate 120, and also functions as a spacer for keeping the distance between the substrate 110 and the substrate 120.

Multiple electronic components 130 are mounted on the upper surface of the substrate 110. All the electronic components 130 are disposed between the substrates 110 and 120, and are enclosed by the shield 150 in the XY plane. This is because the electronic components 130 are potential sources of noise such as electromagnetic waves.

The IC chip 140 is an example of a circuit component, and is connected via the solder balls 141 to the pads 112 on the upper surface of the substrate 110. Thus, the IC chip 140 is electrically connected to the electronic components 130 via, for example, wiring of the substrate 110.

The IC chip 140 includes an analog circuit. The analog circuit is, for example, a radio frequency (RF) circuit for radio communications and emits electromagnetic waves. Therefore, the IC chip 140 is disposed between the substrates 110 and 120, and is enclosed by the shield 150 in the XY plane.

In other words, the shield 150 is disposed between the substrates 110 and 120, and encloses all the electronic components 130 and the IC chip 150 in the XY plane. The shield 150 is connected through the via 123 to the conductive layer 122 of the substrate 120. The shield 150 and the conductive layer 122 are kept at a ground potential.

Thus, in effect, the lateral and upper sides of all the electronic components 130 and the IC chip 140 are covered by the shield 150. The shield 150 is made of a metal material such as aluminum or iron.

As described above, in the electronic device 100 of the first embodiment, the lateral and upper sides of all the electronic components 130 and the IC chip 140 are shielded by the shield 150 and the conductive layer 122.

The electronic device 100 is to be surface-mounted on, for example, a motherboard (not shown). Therefore, the lower sides of the electronic components 130 and the IC chip 140 are shielded by a conductive layer (typically, a ground layer) of the motherboard.

Thus, the first embodiment makes it possible to provide a highly-shielded, surface-mount electronic device.

According to the first embodiment, the substrate 110 and the substrate 120 are connected to each other via the electronic components 130. This configuration improves the flexibility in designing wiring of the substrate 110 and the substrate 120.

Also according to the first embodiment, the electronic component 130 is mounted on the substrate 110 such that the terminal 131 faces downward and the terminal 132 faces upward. With this configuration, the orientation in the XZ plane of the electronic component 130 mounted on the substrate 110 is different by 90 degrees from a case where the electronic component 130 is mounted on the substrate 110 such that the terminals 131 and 132 face sideways.

That is, in the first embodiment, different from a case where the electronic component 130 is mounted horizontally on the substrate 110 such that the terminals 131 and 132 face sideways, the electronic component 130 is mounted vertically on the substrate 110 such that the terminals 131 and 132 face downward and upward.

When the lateral length of the electronic component 130 is long, the mounting area of the electronic component 130 on the substrate 110 can be reduced by mounting the electronic component 130 vertically on the substrate 110 such that the terminals 131 and 132 face downward and upward.

This in turn makes it possible to reduce the size of the electronic device 100 in the XY plane.

The electronic device 100 may be used, for example, for a cell phone, a personal computer, and a printer.

The electronic device 100 of the first embodiment may be assembled as described below.

Figure 3A:
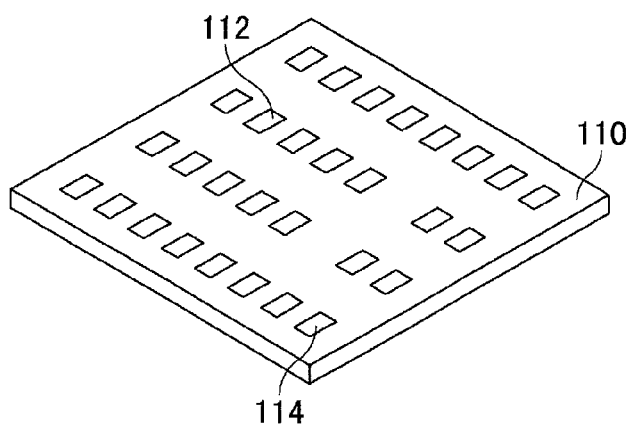
FIGS. 3A and 3B are drawings used to describe a method of assembling an electronic device of the first embodiment.
Figure 3B:
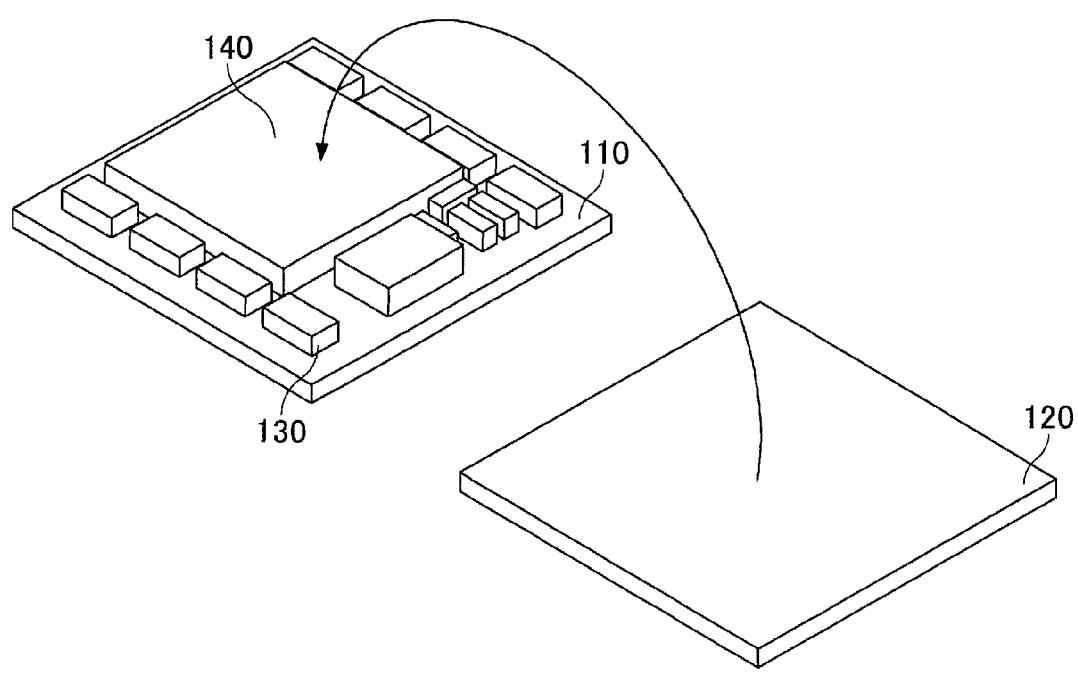

FIGS. 3A and 3B are drawings used to describe a method of assembling the electronic device 100 of the first embodiment.

As illustrated by FIG. 3A, the substrate 110, on which the pads 112 and terminals 114 are formed, is prepared. Next, the electronic components 130 and the IC 140 are mounted on the substrate 110 as illustrated by FIG. 3B. Then, as indicated by an arrow in FIG. 3B, the substrate 120 is placed on the substrate 110 on which the electronic components 130 and the IC 140 are mounted. The substrate 120 may be fixed to the substrate 110 by connecting terminals on the lower surface of the substrate 120 to the terminals 132 (see FIG. 2) of the electronic components 130 with, for example, solder or a conductive adhesive.

Second Embodiment

Figure 4A:
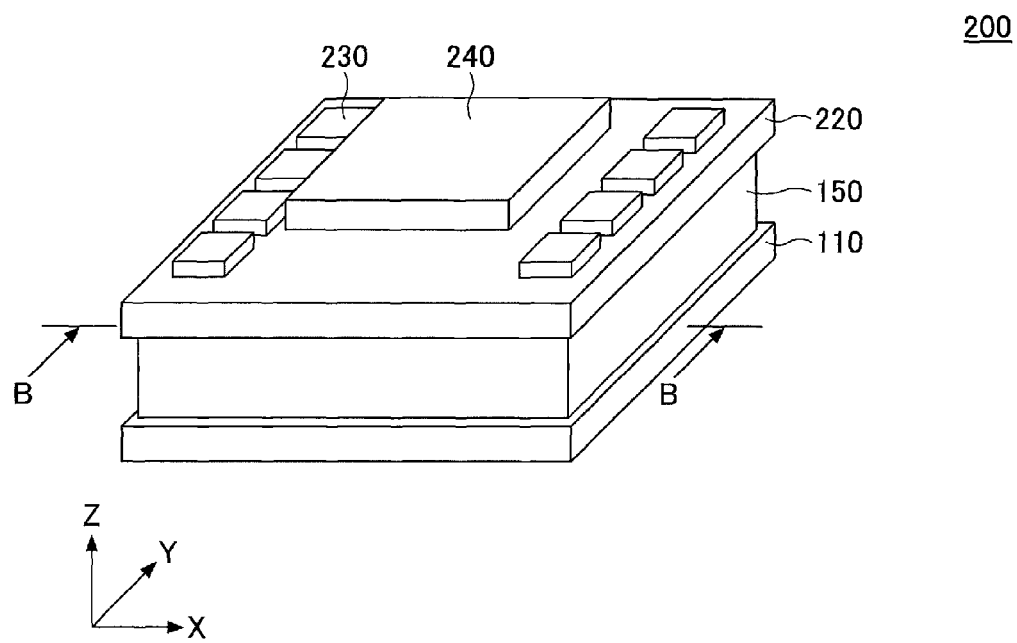
FIGS. 4A and 4B are drawings illustrating an electronic device according to a second embodiment.
Figure 4B:
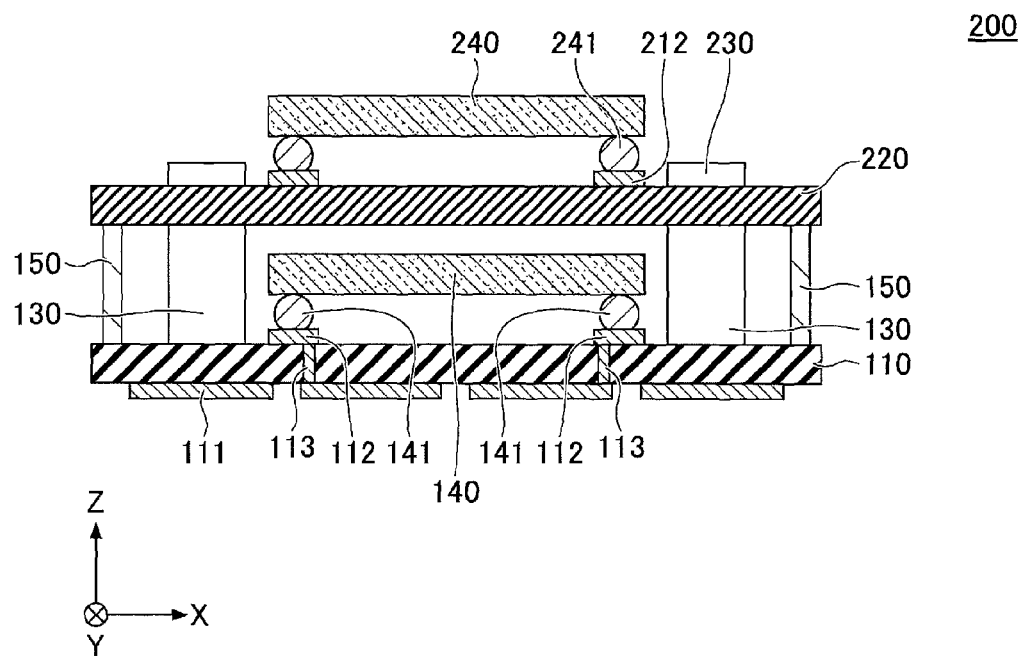

FIG. 4A is a perspective view of an electronic device 200 according to a second embodiment, and FIG. 4B is a cross-sectional view of the electronic device 200 taken along line B-B in FIG. 4A. In FIGS. 4A and 4B, an XYZ coordinate system, which is an orthogonal coordinate system, is defined. Below, the same reference numbers assigned to components of the electronic device 100 of the first embodiment are assigned to the corresponding components of the electronic device 200 of the second embodiment, and descriptions of those components are omitted.

The electronic device 200 includes a substrate 110, a substrate 220, electronic components 130, electronic components 230, an IC chip 140, an IC chip 240, and a shield 150. The electronic device 200 is a surface mount device. For example, the electronic device 200 is surface-mounted on a motherboard (not shown) by connecting a lower surface of the substrate 110 to the motherboard.

The electronic device 200 of the second embodiment has a configuration that is obtained by mounting the electronic components 230 and the IC chip 240 on the substrate 120 of the electronic device 100 of the first embodiment (see FIGS.

1A and 1B). Therefore, differences between the electronic device 200 of the second embodiment and the electronic device 100 of the first embodiment are mainly described below.

The substrate 220 is an example of a second substrate, and has a configuration that is obtained by forming pads 212 on the upper surface of the substrate 120 of the first embodiment. The pads 212 are connected to the electronic components 130 and 230 via wiring formed on the upper surface or the lower surface, or inside of the substrate 220 (the pads 212 connected to the electronic components 230 are not shown).

The electronic component 230 may be a chip component such as a capacitor, an inductor, or a resistor, or may be a chip component including a filter or a diode.

Unlike the electronic component 130 of the first embodiment, terminals of the electronic component 230 may be disposed on the side surfaces instead of the upper and lower surfaces. The electronic components 230 are connected to the electronic components 130 and the pads 212 via wiring formed on the upper surface or the lower surface, or inside of the substrate 220.

Different from the IC chip 140, the IC chip 240 does not emit electromagnetic waves. The IC chip 240 is an example of another electronic component or circuit component. Terminals of the IC chip 240 are connected to the pads 212 via solder balls 241. The IC chip 240 is connected to the electronic components 130 and 230 via wiring formed on the upper surface or the lower surface, or inside of the substrate 220.

Similarly to the electronic device 100 of the first embodiment, the electronic device 200 of the second embodiment is configured such that the lateral and upper sides of all the electronic components 130 and the IC chip 140 are shielded by the shield 150 and the conductive layer 122 (not shown in FIG. 4B).

Also, because the electronic device 200 is to be surface-mounted on a motherboard (not shown), the lower sides of the electronic components 130 and the IC chip 140 are shielded by a conductive layer (typically, a ground layer) of the motherboard.

Thus, the second embodiment makes it possible to provide a highly-shielded, surface-mount electronic device.

Also in the electronic device 200 of the second embodiment, the electronic components 230 and the IC chip 240 are mounted on the substrate 220. This configuration makes it possible to reduce the size of the electronic device 200 in the XY plane. Compared with a case where the electronic components 130 and 230 and the IC chips 140 and 240 are mounted on the substrate 110 whose size is increased in the XY plane, the configuration of the second embodiment makes it possible to reduce the size of the electronic device 200 in the XY plane by about half.

Although two IC chips 140 and 240 are stacked using two substrates 110 and 220 in the second embodiment, three or more sets of substrates and IC chips may be stacked.

Third Embodiment

Figure 5A:
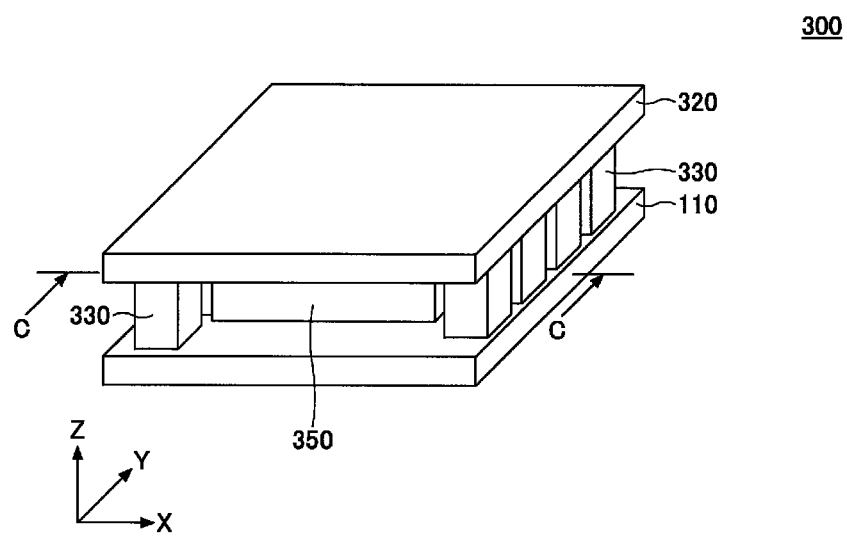
FIGS. 5A and 5B are drawings illustrating an electronic device according to a third embodiment.
Figure 5B:
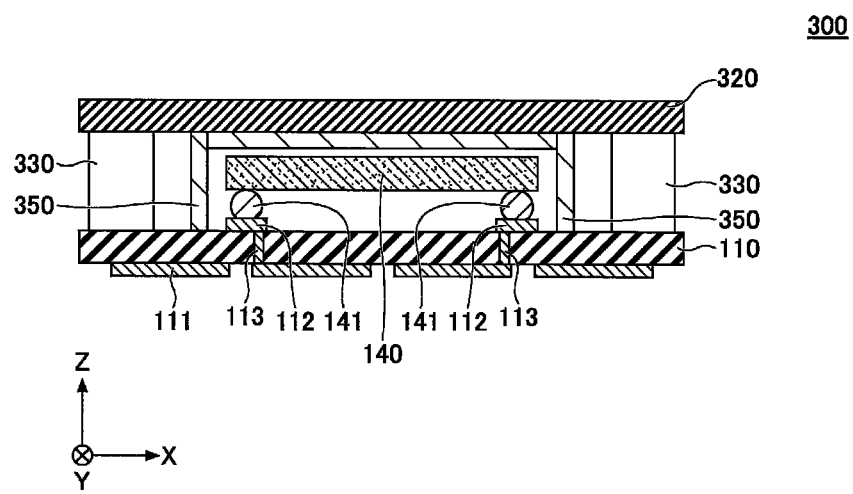

FIG. 5A is a perspective view of an electronic device 300 according to a third embodiment, and FIG. 5B is a cross-sectional view of the electronic device 300 taken along line C-C in FIG. 5A. In FIGS. 5A and 5B, an XYZ coordinate system, which is an orthogonal coordinate system, is defined. Below, the same reference numbers assigned to components of the electronic device 100 of the first embodiment are assigned to the corresponding components of the electronic device 300 of the third embodiment, and descriptions of those components are omitted.

The electronic device 300 includes a substrate 110, a substrate 320, electronic components 330, an IC chip 140, and a shield 350. The electronic device 300 is a surface mount device. For example, the electronic device 300 is surface-mounted on a motherboard (not shown) by connecting a lower surface of the substrate 110 to the motherboard.

The electronic device 300 of the third embodiment has a configuration that is obtained by adding a top plate to the shield 150 of the electronic device 100 of the first embodiment and placing the electronic components 130 outside of the shield 150 (see FIGS. 1A and 1B). Therefore, differences between the electronic device 300 of the third embodiment and the electronic device 100 of the first embodiment are mainly described below.

The substrate 320 is an example of a second substrate and may be implemented, for example, by an FR-4 printed circuit board. The substrate 320 is placed on the substrate 110 via the electronic components 330.

Similarly to the substrate 120 of the first embodiment that is electrically connected to the shield 150, the substrate 320 is electrically connected to the shield 350. The shield 350 is connected to, for example, wiring that is at a ground potential and formed on the upper surface or the lower surface, or inside of the substrate 320. The wiring formed on the substrate 320 is connected to terminals on the upper surfaces of the electronic components 330. The lower surface of the substrate 320 is fixed to the top plate of the shield 350 by, for example, solder.

The electric components 330 receive, for example, digital signals, and do not emit electromagnetic waves. Terminals on the lower surfaces of the electronic components 330 are electrically connected to, for example, wiring on the substrate 110. The electric components 330 are, for example, radio modules for Bluetooth (registered trademark), wireless LAN, or ZigBee (registered trademark).

The shield 350 covers the lateral sides (four sides) and the upper side of the IC chip 140. The shield 350 is made of a metal material such as aluminum or iron. The height of the shield 350 is substantially the same as the distance between the substrate 110 and the substrate 320 in the Z direction. In other words, the height of the shield 350 is substantially the same as the height of the electronic components 330.

The shield 350 is connected to, for example, wiring formed on the substrate 320 through a via formed on a lower surface of the substrate 320 (which is similar to the via 123 in the first embodiment). The wiring is at a ground potential, and therefore the shield 350 is kept at the ground potential. Thus, in effect, the lateral and upper sides of the IC chip 140 are covered by the shield 350. The top plate of the shield 350 is fixed to the lower surface of the substrate 320 by, for example, solder.

As described above, in the electronic device 300 of the third embodiment, the lateral and upper sides of the IC chip 140 are shielded by the shield 350.

Also, because the electronic device 300 is to be surface-mounted on, for example, a motherboard (not shown), the lower side of the IC chip 140 is shielded by a conductive layer (typically, a ground layer) of the motherboard.

Thus, the third embodiment makes it possible to provide a highly-shielded, surface-mount electronic device.

Also in the third embodiment, the top plate of the shield 350 is fixed to the lower surface of the substrate 320 by, for example, solder. This configuration makes it possible to increase the bonding strength between the substrate 110 and the substrate 320 of the electronic device 300.

Fourth Embodiment

Figure 6A:
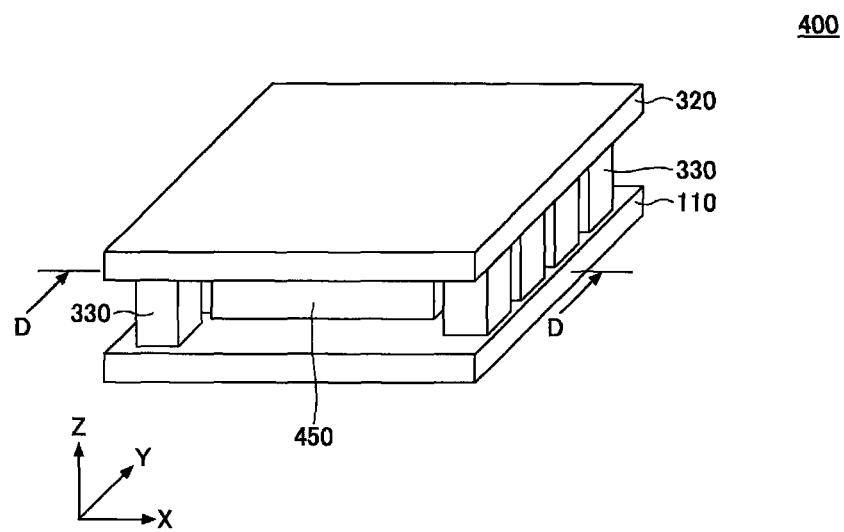
FIGS. 6A and 6B are drawings illustrating an electronic device according to a fourth embodiment.
Figure 6B:
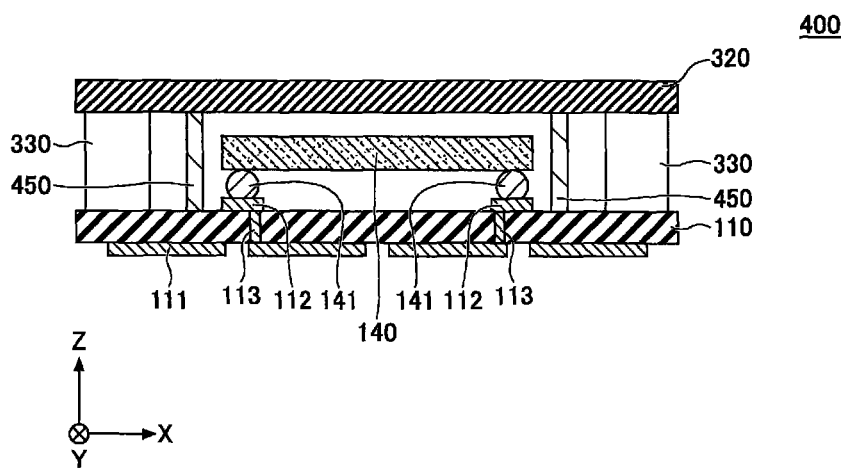

FIG. 6A is a perspective view of an electronic device 400 according to a fourth embodiment, and FIG. 6B is a cross-sectional view of the electronic device 400 taken along line D-D in FIG. 6A. In FIGS. 6A and 6B, an XYZ coordinate system, which is an orthogonal coordinate system, is defined. Below, the same reference numbers assigned to components of the electronic devices 100 and 300 of the first and third embodiments are assigned to the corresponding components of the electronic device 400 of the fourth embodiment, and descriptions of those components are omitted.

The electronic device 400 includes a substrate 110, a substrate 320, electronic components 330, an IC chip 140, and a shield 450. The electronic device 400 is a surface mount device. For example, the electronic device 400 is surface-mounted on a motherboard (not shown) by connecting a lower surface of the substrate 110 to the motherboard.

The electronic device 400 of the fourth embodiment has a configuration that is obtained by switching the positions of the shield 150 and the electronic components 130 of the electronic device 100 of the first embodiment (see FIGS. 1A and 1B). In other words, the electronic device 400 of the fourth embodiment has a configuration that is obtained by removing the top plate of the shield 350 of the electronic device 300 of the third embodiment (see FIGS. 5A and 5B). Similarly to the electronic components 330 of the third embodiment, the electric components 330 of the fourth embodiment do not emit electromagnetic waves.

Below, differences between the electronic device 400 of the fourth embodiment and the electronic devices 100 and 300 of the first and third embodiments are mainly described.

The substrate 320 is placed on the substrate 110 via the electronic components 330. Wiring formed on the substrate 320 is connected to terminals on the upper surfaces of the electronic components 330. Similarly to the substrate 120 of the first embodiment that is electrically connected to the shield 150, the substrate 320 is electrically connected to the shield 450. The shield 450 is connected to, for example, wiring formed on the substrate 320 that is at a ground potential.

Similarly to the shield 150 of the first embodiment, the shield 450 (and the substrate 320) covers the lateral sides (four sides) and the upper side of the IC chip 140. The shield 450 is made of a metal material such as aluminum or iron.

The shield 450 is connected to wiring formed on the substrate 320 through a via formed on a lower surface of the substrate 320 (which is similar to the via 123 in the first embodiment). The wiring to be connected to the shield 450 is at a ground potential, and therefore the shield 450 is kept at the ground potential. Thus, in effect, the lateral and upper sides of the IC chip 140 are covered by the shield 450.

As described above, in the electronic device 400 of the fourth embodiment, the lateral and upper sides of the IC chip 140 are shielded by the shield 450.

Also, because the electronic device 400 is to be surface-mounted on, for example, a motherboard (not shown), the lower side of the IC chip 140 is shielded by a conductive layer (typically, a ground layer) of the motherboard.

Thus, the fourth embodiment makes it possible to provide a highly-shielded, surface-mount electronic device.

Electronic components 230 and an IC chip 240 may also be mounted on the substrate 320 of the electronic device 400 of the fourth embodiment.

Figure 7A:
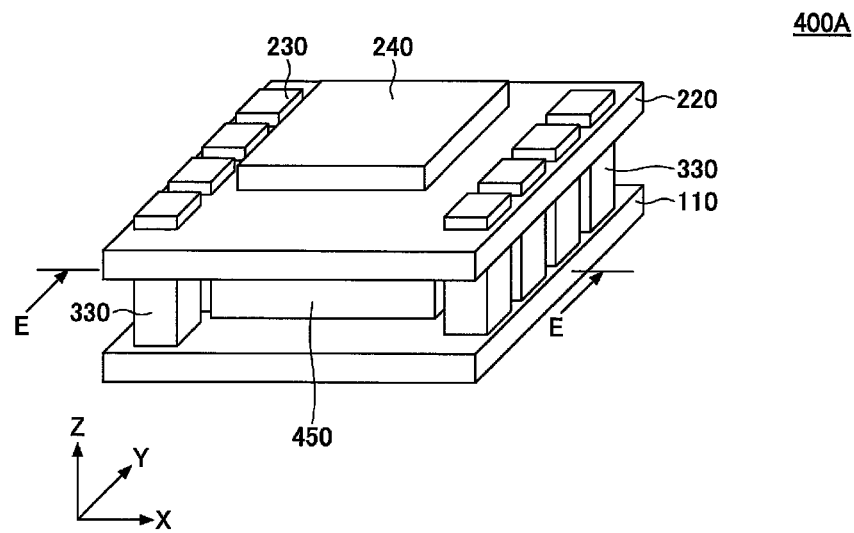
FIGS. 7A and 7B are drawings illustrating an electronic device according to a variation of the fourth embodiment.
Figure 7B:
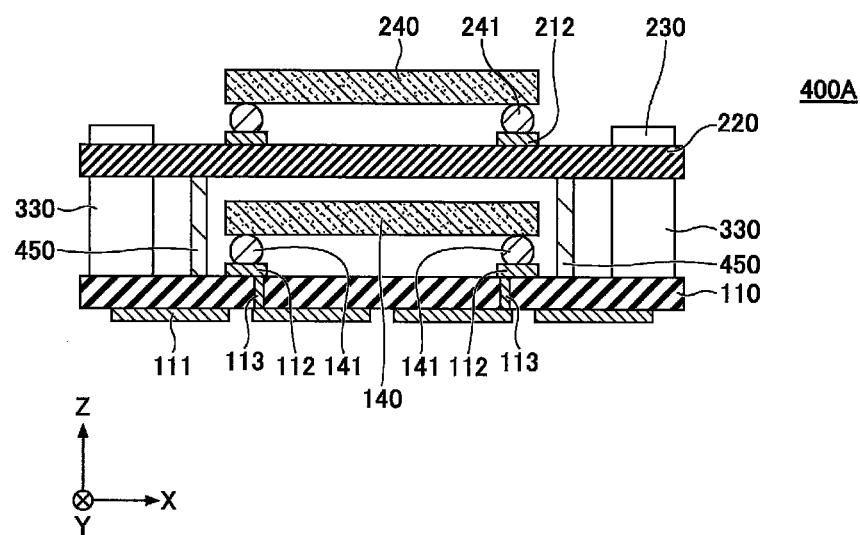

FIG. 7A is a perspective view of an electronic device 400A according to a variation of the fourth embodiment, and FIG. 7B is a cross-sectional view of the electronic device 400A taken along line E-E in FIG. 7A.

The electronic device 400A of FIG. 7 includes a substrate 110, a substrate 220, electronic components 130, electronic components 230, an IC chip 140, an IC chip 240, and a shield 450.

Similarly to the electronic device 200 of the second embodiment, the electronic device 400A of the variation of the fourth embodiment has a configuration that is obtained by adding the electronic components 230 and the IC chip 240 to the electronic device 400 of the fourth embodiment (see FIGS. 5A and 5B).

Thus, the variation of the fourth embodiment makes it possible to provide a highly-shielded, surface-mount electronic device.

Also, the variation of the fourth embodiment makes it possible to reduce the size of the electronic device 400A in the XY plane.

Although two IC chips 140 and 240 are stacked using two substrates 110 and 220 in FIGS. 7A and 7B, three or more sets of substrates and IC chips may be stacked.

Fifth Embodiment

Figure 8A:
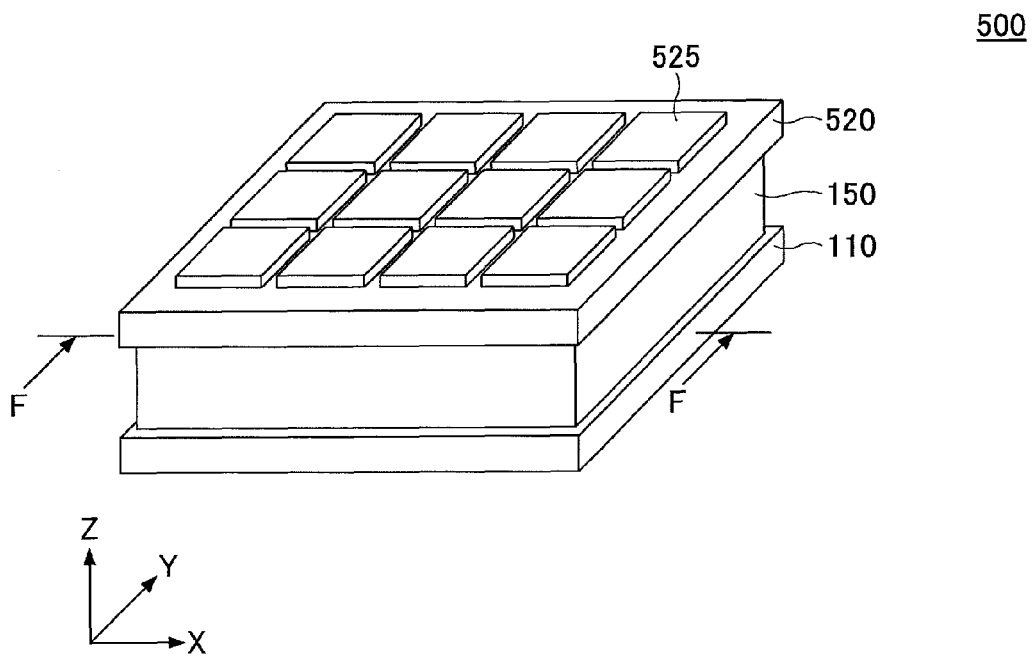
FIGS. 8A and 8B are drawings illustrating an electronic device according to a fifth embodiment.
Figure 8B:
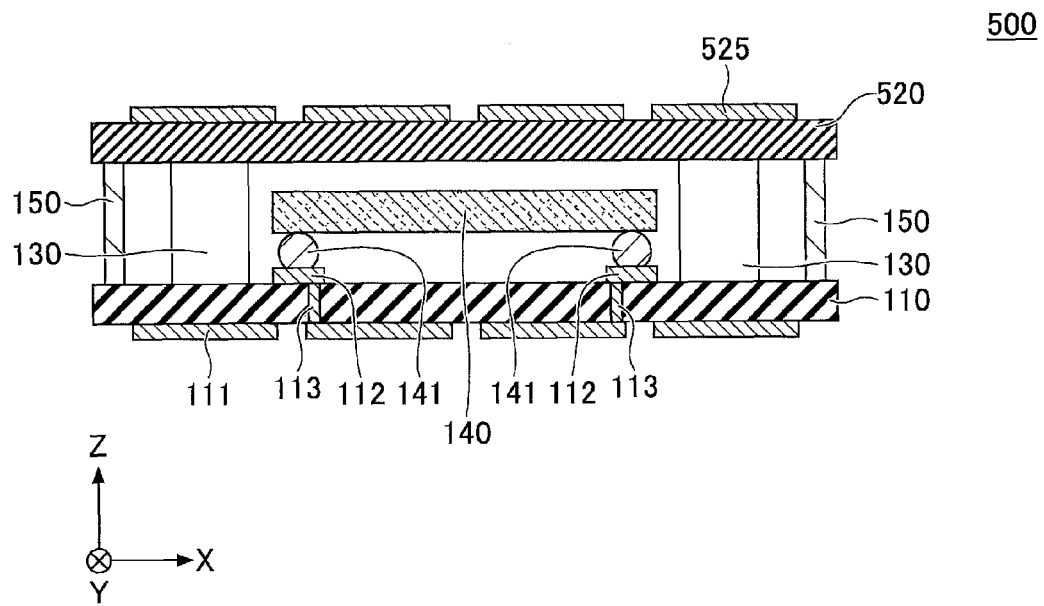

FIG. 8A is a perspective view of an electronic device 500 according to a fifth embodiment, and FIG. 8B is a cross-sectional view of the electronic device 500 taken along line F-F in FIG. 8A. In FIGS. 8A and 8B, an XYZ coordinate system, which is an orthogonal coordinate system, is defined. The same reference numbers assigned to components of the electronic device 100 of the first embodiment are assigned to the corresponding components of the electronic device 500 of the fifth embodiment, and descriptions of those components are omitted.

The electronic device 500 includes a substrate 110, a substrate 520, electronic components 130, an IC chip 140, and a shield 150. The electronic device 500 is a surface mount device. For example, the electronic device 500 is surface-mounted on a motherboard (not shown) by connecting a lower surface of the substrate 110 to the motherboard.

The electronic device 500 of the fifth embodiment has a configuration that is obtained by replacing the substrate 120 of the electronic device 100 of the first embodiment (see FIGS. 1A and 1B) with the substrate 520. Therefore, differences between the electronic device 500 of the fifth embodiment and the electronic device 100 of the first embodiment are mainly described below.

The substrate 520 is an example of a second substrate and may be implemented, for example, by an FR-4 printed circuit board. The substrate 520 is placed on the substrate 110 via the electronic components 130.

The substrate 520 is obtained by forming electrodes 525 on the upper surface of the substrate 120 of the first embodiment. The electrodes 525 are an example of a second electrode.

The electrodes 525 are connected to the electronic components 130 via, for example, wiring formed on the substrate 520. Because the electronic components 130 are electrically connected via the substrate 110 to the IC chip 140, the electrodes 525 are electrically connected to the IC chip 140.

Also, because the IC chip 140 is electrically connected to the electrodes 111 of the substrate 110, the electrodes 525 are electrically connected via the IC chip 140 to the electrodes 111.

In the electronic device 500 of the fifth embodiment, the electrodes 111 and the electrodes 525 are configured for interfaces of different standards. For example, the electrodes 111 may be configured for an interface of a USB terminal, and the electrodes 525 may be configured for an interface of an SD card.

The electrodes 111 and the electrodes 525 may also be configured for interfaces of standards other than the USB terminal and the SD card, as long as they are used for interfaces of different standards.

When signal processing is necessary before transferring a signal input via the electrodes 111 to the electrodes 525 or transferring a signal input via the electrodes 525 to the electrodes 111, the IC chip 140 may be configured to perform the signal processing.

Thus, the fifth embodiment makes it possible to provide a highly-shielded, surface-mount electronic device.

The electronic device 500 of the fifth embodiment can handle signals of different standards with the electrodes 111 and the electrodes 525. The configuration of the fifth embodiment makes it possible to efficiently arrange the electrodes 111 and the electrodes 525 on the lower surface of the substrate 110 and the upper surface of the substrate 520, and makes it possible to reduce the number of electrodes and an area occupied by the electrodes.

Although the electrodes 111 and the electrodes 525 are configured for interfaces of different standards in the fifth embodiment, the electrodes 111 and the electrodes 525 may be configured for interfaces of the same standard.

Sixth Embodiment

Figure 9:
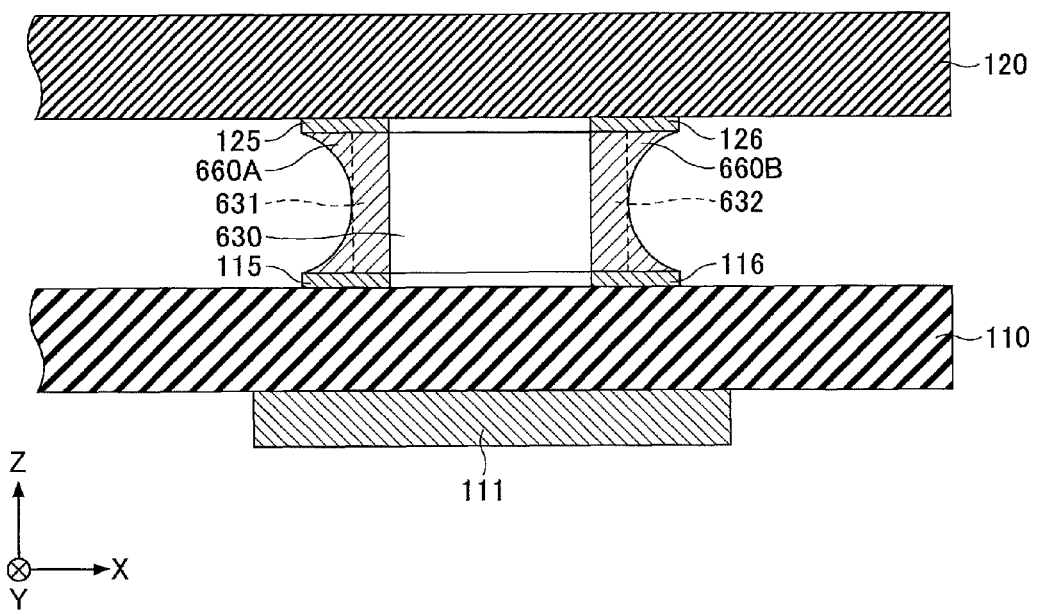
FIG. 9 is a drawing illustrating an electronic device according to a sixth embodiment.

FIG. 9 is a drawing illustrating an electronic device 600 according to a sixth embodiment.

The electronic device 600 of the sixth embodiment includes a substrate 110, a substrate 120, electronic components 630, an IC chip 140, and a shield 150. The electronic device 600 is a surface mount device. For example, the electronic device 600 is surface-mounted on a motherboard (not shown) by connecting a lower surface of the substrate 110 to the motherboard.

Differences between the electronic device 600 of the sixth embodiment and the electronic device 100 of the first embodiment are mainly described below.

Although the IC chip 140 and the shield 150 are omitted in FIG. 9, the IC chip 140 and the shield 150 of the electronic device 600 are substantially the same as those of the electronic device 100 of FIG. 1.

The electronic component 630 includes terminals 631 and 632 on the side surfaces. The terminal 631 is an example of a first terminal, and the terminal 632 is an example of a second terminal. The electronic component 630 is mounted horizontally. Accordingly, the orientation of the electronic component 630 in the XZ plane is different by 90 degrees from the orientation of the electronic component 130 of the first embodiment that is mounted vertically such that the terminals 131 and 132 face downward and upward.

The substrate 110 includes terminals 115 and 116 on the upper surface, and the substrate 120 includes terminals 125 and 126 on the lower surface.

The lower end of the terminal 631 of the electronic component 630 is connected to the terminal 115, and the upper end of the terminal 631 is connected to the terminal 125. The terminal 631 is fixed to the terminal 115 and the terminal 125 by solder 660A.

Similarly, the lower end of the terminal 632 of the electronic component 630 is connected to the terminal 116, and the upper end of the terminal 632 is connected to the terminal 126. The terminal 632 is fixed to the terminal 116 and the terminal 126 by solder 660B.

Thus, the horizontally-oriented electronic component 630 may be used instead of the vertically-oriented electronic component 130 of the first embodiment.

The sixth embodiment makes it possible to provide a highly-shielded, surface-mount electronic device.

Electronic devices according to embodiments of the present invention are described above. However, the present invention is not limited to the specifically disclosed embodiments, and variations and modifications may be made without departing from the scope of the present invention.

What is claimed is:

1. An electronic device, comprising:
a first substrate including a first electrode formed on a surface of the first substrate;
a second substrate placed on the first substrate;
a plurality of chip electronic components mounted on another surface of the first substrate; and
a shield disposed between the first substrate and the second substrate;
wherein the chip electronic components support the second substrate on the first substrate;
wherein the shield is provided on the another surface of the first substrate; and
wherein the shield supports the second substrate on the first substrate.

2. The electronic device as claimed in claim 1, further comprising:
a circuit component mounted on the another surface of the first substrate in an area enclosed by the shield.

3. The electronic device as claimed in claim 2, wherein the shield includes a top plate that faces the second substrate.

4. The electronic device as claimed in claim 2, wherein
at least one of the first substrate and the second substrate includes a conductive layer that is maintained at a reference potential; and
the shield is connected to the conductive layer.

5. The electronic device as claimed in claim 1, wherein the second substrate includes a second electrode formed on a surface of the second substrate.

6. The electronic device as claimed in claim 5, wherein the first electrode and the second electrode are configured for interfaces of different standards.

7. The electronic device as claimed in claim 1, wherein
each chip electronic component includes a first terminal formed on a first surface of the chip electronic component and a second terminal formed on a second surface of the chip electronic component;
the first terminal is electrically connected to the first substrate; and
the second terminal is electrically connected to the second substrate.

8. The electronic device as claimed in claim 1, wherein
each chip electronic component includes a first terminal and a second terminal formed on a side surface of the chip electronic component;
the first terminal is electrically connected to the first substrate; and
the second terminal is electrically connected to the second substrate.

9. An electronic device, comprising:
a first substrate including a first electrode formed on a surface of the first substrate;
a second substrate placed on the first substrate;
an electronic component mounted on another surface of the first substrate; and
a shield disposed between the first substrate and the second substrate;

wherein the second substrate is placed on the first substrate via the electronic component;

wherein the second substrate includes a conductive layer, an insulating layer that covers the conductive layer, and a via that is formed in the insulating layer and that electrically contacts the conductive layer; and wherein the conductive layer is connected to a ground potential, and extends uniformly over the another surface of the first substrate.

10. An electronic device, comprising:

a first substrate including a first electrode formed on a first surface of the first substrate;

a second substrate placed over the first substrate, a first surface of the second substrate facing a second surface of the first substrate;

a plurality of electronic components connected to both the second surface of the first substrate and the first surface of the second substrate; the electronic components supporting the second substrate on the first substrate; and a shield disposed between the first substrate and the second substrate, the shield being provided on the second surface of the first substrate, and the shield supporting the second substrate on the first substrate.

* * * * *